United States Patent [19]
Komatsu et al.

[11] Patent Number: 5,200,651
[45] Date of Patent: Apr. 6, 1993

[54] COLLECTOR DOT AND CIRCUIT

[75] Inventors: Yoshihiro Komatsu; Masato Kawata, both of Kanagawa, Japan

[73] Assignee: Sony Cororation, Tokyo, Japan

[21] Appl. No.: 792,616

[22] Filed: Nov. 15, 1991

[30] Foreign Application Priority Data

Nov. 20, 1990 [JP] Japan .................................. 2-316415

[51] Int. Cl.[5] .......................................... H03K 19/086
[52] U.S. Cl. .................................... 307/455; 307/443; 307/243
[58] Field of Search ............... 307/443, 445, 455, 494, 307/243; 341/127

[56] References Cited

U.S. PATENT DOCUMENTS

| | | | |
|---|---|---|---|
| 4,580,066 | 4/1986 | Berndt | 307/455 X |
| 4,609,837 | 9/1986 | Yagyuu et al. | 307/455 |
| 4,628,216 | 12/1986 | Mazumder | 307/455 |
| 4,628,217 | 12/1986 | Berndt | 307/455 X |
| 4,764,886 | 8/1988 | Yano | 364/787 |
| 4,785,422 | 11/1988 | Berndt et al. | 365/225.6 |
| 4,835,771 | 5/1989 | Moussie | 307/243 X |
| 4,841,168 | 6/1989 | Kubota | 307/443 X |
| 4,868,420 | 9/1989 | Itoh et al. | 307/443 X |
| 4,986,666 | 1/1991 | Homma et al. | 365/230.08 |
| 5,086,414 | 2/1992 | Nambu et al. | 365/230.08 |

Primary Examiner—David Hudspeth
Attorney, Agent, or Firm—Hill, Steadman & Simpson

[57] ABSTRACT

A multi-output collector dot AND circuit wherein a logical AND signal can be formed from a pair of adjacent circuits and another logical AND circuit can also be formed from a pair of circuits spaced from each other. The collector dot AND circuit comprises a plurality of output transistors which are cascade connected to an output electrode of one of a pair of transistors constituting a differential circuit so that an output or outputs different from an output which is used to obtain a logical AND signal together with an output of an adjacent differential circuit are obtained from the one transistor. A number of dummy transistors equal to the number of the output transistors are cascade connected to an output electrode of the other transistor. Further, a constant-current source is connected to the differential circuit such that an electric current which flows from each of the output transistors connected to the one transistor is made equal in magnitude to an electric current which flows from a transistor of the adjacent differential circuit.

3 Claims, 3 Drawing Sheets

COLLECTOR DOT AND CIRCUIT

BACKGROUND OF THE INVENTION

1. Field of the Invention

This invention relates to a collector dot AND circuit, and more particularly to a collector dot AND circuit suitable for use to construct a multi-output AND circuit.

2. Description of the Prior Art

A collector dot AND circuit in which a latched comparator circuit is incorporated is conventionally employed in various technical fields such as, for example a field of logic circuits. An exemplary one of conventional collector dot circuits is shown in FIG. 2. Referring to FIG. 2, the collector dot circuit shown includes a first differential circuit 30 constituted from a pair of transistors Q2 and Q8, and a second differential circuit 31 constituted from another pair of transistors Q10 and Q16. Electric currents flowing through a pair of constant-current sources 32 and 33 are supplied to the first and second differential circuits 30 and 31 by way of a pair of transistors Q4 and Q12, respectively.

A reference signal is supplied to the base of the transistor Q2 constituting the first differential circuit 30 while an analog input signal A1 is supplied to the base of the other transistor Q8. Similarly, another reference signal is supplied to the base of the transistor Q10 constituting the second differential circuit 31 while another analog signal A2 is supplied to the base of the other transistor Q16.

The collector of the transistor Q2 is connected to a power source Vcc by way of a resistor R1, a transistor Q1 and another resistor R2, and an AND output signal B1 is obtained from a junction between the transistor Q1 and the resistor R2.

A resistor R3 and a transistor Q7 are connected to the collector of the transistor Q8 while another resistor R5 and another transistor Q9 are connected to the collector of the transistor Q10. The collectors of the transistors Q7 and Q9 are connected commonly, and an AND output signal B2 is obtained from a junction between the collectors of the transistors Q7 and Q9. The commonly connected collectors of the transistors Q7 and Q9 are connected to the power source Vcc by way of a resistor R4.

The collector of the transistor Q16 is connected to the power source Vcc by way of a resistor R6, a transistor Q15 and another resistor R7, and an output is extracted from a junction between the transistor Q15 and the resistor R7 and is supplied to a differential circuit at a next stage.

A latch circuit 34 constituted from a pair of transistors Q3 and Q6 for effecting a latching operation is connected to the first differential circuit 30 having such construction as described above, and an electric current flowing through the constant-current source 32 is supplied to the latch circuit 34 by way of a transistor Q5. Meanwhile, another latch circuit 35 constituted from a pair of transistors Q11 and Q14 is connected to the second differential circuit 31, and an electric current flowing through the constant-current source 33 is supplied to the latch circuit 35 by way of a transistor Q13.

In the conventional collector dot AND circuit of FIG. 2 having such construction as described above, when an inverted clock signal CLK presents a high ("H") level, the transistors Q4 and Q12 present an on state, and consequently, comparison between a reference signal and an input analog signal is performed with each of the first and second differential circuits 30 and 31. On the contrary when a clock signal CLK presents an "H" level, the transistors Q5 and Q13 present an on state, and consequently, latching of the comparator is performed.

Thus, an AND output corresponding to two analog input signals A1 and A2 is obtained from the collectors of the transistors Q7 and Q9 which are connected commonly and connected to the power source by way of the pull-up resistor R4.

In this manner, conventional collector dot AND circuits are constructed such that the collectors of transistors which constitute a pair of adjacent differential circuits are connected commonly and an AND output signal is obtained from the thus commonly connected collectors of the transistors. Accordingly, an analog to digital converter having such a construction as shown, for example, in FIG. 3 cannot be constructed using a collector dot AND circuit.

In particular, referring to FIG. 3, the analog to digital converter shown includes a resistor set 40 including cascade connected resistors PR1 to PR16, a comparator block 41 for comparing voltages of adjacent ones of the resistors PR1 to PR16, a higher order bit controlling AND gate block 42, a lower order bit controlling AND gate block 43, a higher order bit encoder 44, a lower order bit encoder 45 and so forth. The analog to digital converter thus outputs, from digital signal output terminals D1 (MSB) to D4 (LSB) thereof, digital signals corresponding to input analog signals A1 to A15.

The analog to digital converter produces AND output signals B1 to B15 using a plurality of AND gates. And, as apparently seen from FIG. 3, the AND output signals B8 and B12 are formed not from two adjacent circuits but from two circuits provided in a spaced relationship by four circuit distances from each other. Accordingly, if it is tried to construct such a circuit as shown in FIG. 3 using a conventional collector dot AND circuit, additional gates are required as much which makes the scale of the entire circuitry large. Further, if the number of gates increases, then a delay of a signal is increased and the power consumption is increased.

SUMMARY OF THE INVENTION

It is an object of the present invention to provide a multi-output collector dot AND circuit wherein a logical AND signal can be formed from a pair of adjacent circuits and another logical AND circuit can also be formed from a pair of circuits spaced from each other.

In order to attain the above object, in a collector dot AND circuit according to the present invention, a plurality of output transistors are cascade connected to an output electrode of one of a pair of transistors constituting a differential circuit so that an output or outputs different from an output which is used to obtain a logical AND signal together with an output of an adjacent differential circuit may be obtained from the one transistor. Meanwhile, a number of transistors equal to the number of output transistors cascade connected to the one transistor are cascade connected as dummy transistors to an output electrode of the other transistor constituting the differential circuit. Consequently, an electric current having a magnitude equal to that of an electric current flowing from the output terminal of the one transistor will flow from the output terminal of the other transistor, which provides good balancing between electric currents flowing through the two transistors of the differential circuit. Further, an electric current which flows from each of the output transistors connected to the one transistor is made equal in magnitude to an electric current which flows from a transistor of the adjacent differential circuit.

In particular, according to the present invention, there is provided a collector dot AND circuit which comprises a first differential circuit including first and second transistors differentially connected to each other, a first output transistor connected to an output electrode of the first transistor, a second output transistor connected to an output electrode of the second transistor, a second differential circuit including third and fourth transistors differentially connected to each other, a predetermined plural number of third output transistors cascade connected to an output electrode of the third transistors for dividing an electric current outputted from the third transistor into electric currents of the predetermined plural number, an output terminal of one of the third output transistors being connected to an output terminal of the second output transistor so as to provide an AND output signal, a same predetermined plural number of dummy transistors connected between an output electrode of the fourth transistor and a power source for causing an electric current having an equal magnitude to that of an electric current flowing through the third transistor to flow through the fourth transistors, a first constant-current source for supplying a constant electric current to the first differential circuit, and a second constant-current source for supplying a constant electric current to the second differential circuit so that an electric current outputted from each of the third output transistors is equal in magnitude to an electric current outputted from the first output transistor.

With the collector dot AND circuit, an electric current of an equal magnitude flows from the output terminals of the first to fourth transistors of the first and second differential circuits, and electric currents required for such electric currents to flow from the first to fourth transistors are supplied from the first and second constant-current sources. Accordingly, the collector dot AND circuit of the multi-output type can be constructed without the sacrifice of balancing of output electric currents. Consequently, when a plurality of AND circuits are combined to construct various circuits, the circuit can be constructed with a reduced number of necessary gates and the entire circuit construction can be reduced in size. As a result, a gate delay can be reduced and the power consumption can be reduced.

The above and other objects, features and advantages of the present invention will become apparent from the following description and the appended claims, taken in conjunction with the accompanying drawings.

DETAILED DESCRIPTION OF THE PREFERRED EMBODIMENT

Figure 1:
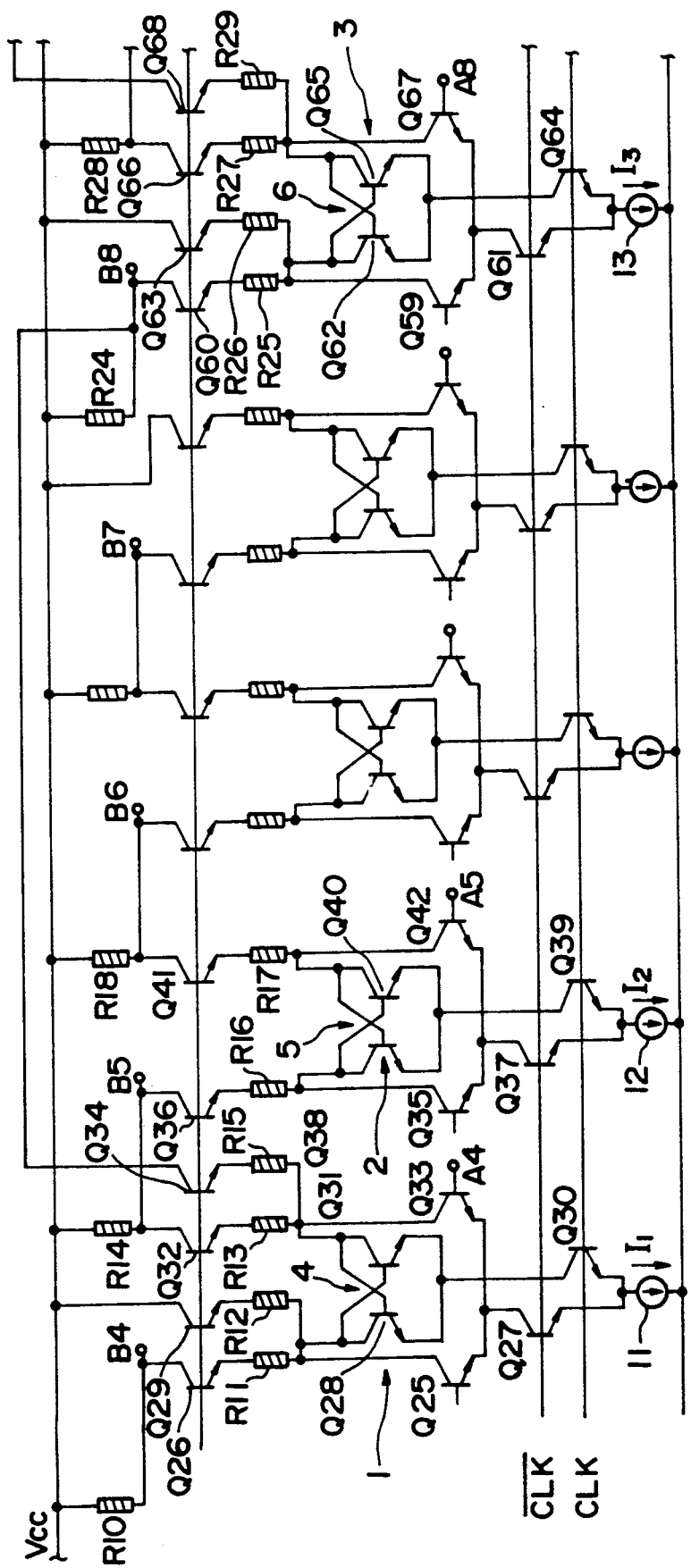
FIG. 1 is a circuit diagram of a collector dot AND circuit showing a preferred embodiment of the present invention.
Figure 2:
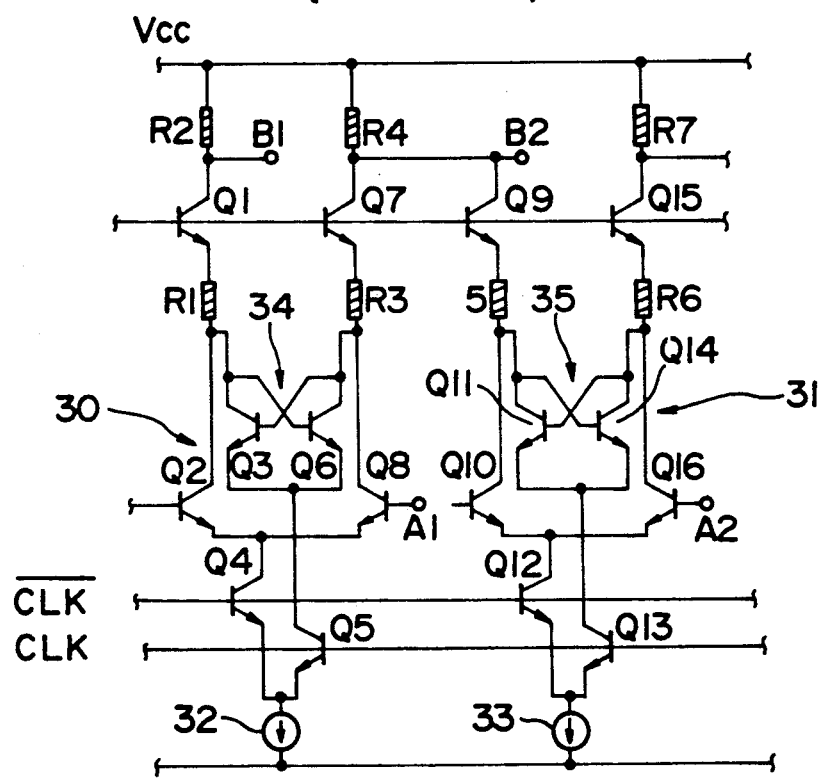
FIG. 2 is a circuit diagram showing a conventional collector dot AND circuit.

Referring to FIG. 1, there is shown a collector dot AND circuit to which the present invention is applied. Here, the collector dot AND circuit is applied, as apparently seen from FIG. 1, so as to make part of the analog to digital converter shown in FIG. 3 and particularly corresponds to a circuit portion for forming an AND output signal B8 of the analog to digital converter.

A first differential circuit 1 to which an analog signal A4 is supplied includes a pair of transistors Q25 and Q33, and an electric current $I_1$ flowing through a first constant-current source 11 is supplied to the first differential circuit 1 by way of a transistors Q27.

A second differential circuit 2 is provided adjacent the first differential circuit 1, and another analog signal A5 is supplied to the second differential circuit 2. The second differential circuit 2 includes a pair of transistors Q35 and Q42, and an electric current $I_2$ flowing through a second constant-current source 12 is supplied to the second current source 2 by way of a transistor Q37.

A third differential circuit 3 to which a further analog signal A8 is supplied is provided at a location spaced by four circuit distances from the first differential circuit 1. The third differential circuit 3 includes a pair of transistors Q59 and Q67, and an electric current $I_3$ flowing through a third constant-current source 13 is supplied to the third differential circuit 3 by way of a transistor Q61.

Latch circuits 4, 5 and 6 are provided for the first to third differential circuits 1, 2 and 3, respectively, and each circuit is constructed as a collector dot AND circuit including a latched comparator. The latch circuit 4 is constituted from a pair of transistors Q28 and Q31: the latch circuit 5 is constituted from another pair of transistors Q38 and Q40: and the latch circuit 6 is constituted from a further pair of transistors Q62 and Q65.

Each of the latch circuits 4, 5 and 6 is constructed such that an output terminal of each of a pair of transistors thereof is connected to an input terminal of the other transistor, and an electric current $I_1$ flowing through the first constant-current source 11 is supplied to the latch circuit 4 by way of a transistor or Q30. Meanwhile, an electric current $I_2$ flowing through the second constant-current source 12 is supplied to the latch circuit 5 by way of a transistor Q39 while an electric current $I_3$ flowing through the third constant-current source 13 is supplied to the latch circuit 6 by way of a transistor Q64.

A single resistor R16 is connected to the collector of the transistor Q35 constituting the second differential circuit 2 while another single resistor R17 is connected to the collector of the other transistor Q42 constituting the second differential circuit 2 in a similar manner as in an ordinary collector dot AND circuit, and a pair of transistors Q36 and Q41 are cascade connected to the resistors R16 and R17, respectively.

On the other hand, two resistors are connected to the collector of each of the transistors which constitute the first and third differential circuits 1 and 3. In particular, a pair of resistors R11 and R12 are connected to the transistor Q25 of the first differential circuit 1 while another pair of resistors R13 and R15 are connected to the transistor Q33. Meanwhile, a pair of resistors R25 and R26 are connected to the transistor Q59 of the third differential circuit 3 while another pair of resistors R27 and R29 are connected to the transistor Q67. Cascade connection transistors Q26, Q29, Q32, Q34, Q60, Q63, Q66 and Q68 are connected to the resistors R11, R12, R13, R15, R25, R26, R27 and R29, respectively, and consequently, an electric current flowing through each of the transistors constituting the differential circuits is divided into two circuits.

Of the cascade connection transistors, the transistor Q26 is connected to a power source Vcc by way of a resistor R10 and also to an output terminal for an AND output signal B4. The transistor Q32 is connected to the power source Vcc by way of a resistor R14 and also to an output terminal for another AND output signal B5. Also the transistor Q36 of the second differential circuit 2 is connected to the output terminal for the AND output signal B5. Accordingly, such AND output signal B5 is an AND signal between the input analog signals A and B.

The transistors Q29 and Q63 are provided as dummy transistors and connected directly to the power source Vcc. The transistor Q41 is connected to the power source Vcc by way of a resistor R18 and also to an output terminal for a further AND output signal B6.

In the meantime, the transistor Q34 is connected commonly to the transistor Q60 of the third differential circuit 3. The transistor Q34 is further connected to the power source Vcc by way of a resistor R24 and also to an output terminal for the AND output signal B8. Meanwhile, the transistor Q66 is connected to the power source Vcc by way of a resistor R28, and the transistor Q68 is connected to another circuit provided at a spaced location.

In the collector dot AND circuit of the present embodiment having such construction as described above, similarly to the conventional collector dot AND circuit described hereinabove, when an inverted clock signal CLK presents an "H" level, the transistors Q27, Q37 and Q61 present an on state, and consequently, comparison between a reference signal and an input analog signal is performed with each of the first, second and third differential circuits 1, 2 and 3. It is to be noted that comparison is performed also with the remaining differential circuits of the analog to digital converter to which no reference character is applied, but description thereof will be omitted herein. On the contrary when a clock signal CLK presents an "H" level, the transistors Q30, Q39 and Q64 present an on state, and consequently, latching with the comparators is performed.

Figure 3:
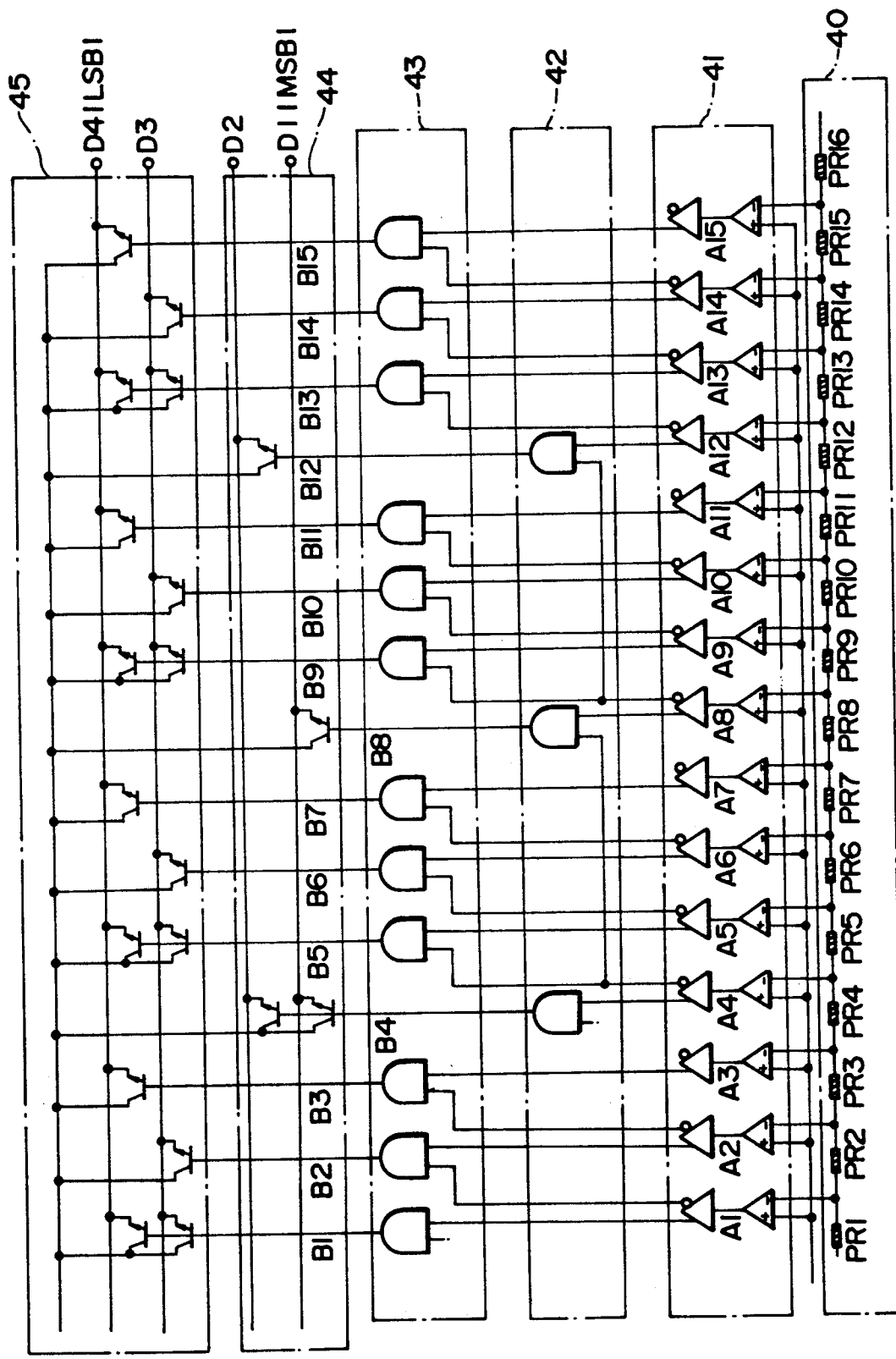
FIG. 3 is a block diagram showing a parallel comparison type analog to digital converter constructed from a plurality of AND circuits in combination.

When such operation takes place, electric currents flow into the collectors of the transistors which constitute the differential circuits 1, 2 and 3, but in the collector dot AND circuit of the present embodiment, the cascade connection transistors are provided such that each of output electric currents of the transistors constituting each of the first and differential circuits is divided into two circuits. Accordingly, with the collector dot AND circuit of the present embodiment, not only an AND signal can be formed by two adjacent differential circuits, but also another AND output signal between signals inputted to two differential circuits which are provided at locations spaced from each other by, for example, four circuit distances can be formed. Consequently, such a circuit as shown in FIG. 3 can be constructed without provision of additional gates. As a result, the entire circuit construction can be reduced. Further, since the number of gates is reduced, a gate delay can be reduced and the power consumption can be reduced. In this instance, in order for each of two divided electric currents to have a magnitude substantially equal to a magnitude of an ordinary electric current, the magnitude of the electric currents $I_1$ and $I_3$ flowing through the first and third constant-current sources 11 and 13, respectively, is set to twice that of the electric current $I_2$ flowing through the second constant-current source 2.

On the other hand, it does not have the latch circuit 4, 5 and 6 in this circuit, the circuit construction described above may be modified such that the emitters of the transistors Q26 and Q29, the emitters of the transistors Q32, Q34 and Q60, Q63 and the emitters of the transistors Q66 and Q68 are connected to each other. In this instance, however, it sometimes occurs that the magnitude of an electric current cannot be made accurately to one half since it is influenced by Vbe balances of the component transistors which are varied by a dispersion in forward voltage and a dispersion in area. Accordingly, in case it is intended to construct a highly accurate circuit, resistors should be connected as in the collector dot AND circuit of the embodiment described above.

It is to be noted that, while the collector dot AND circuit of the embodiment described above is constructed so as to provide two outputs, also a collector dot AND circuit can be constructed from which three or more outputs can be extracted. In such circuit construction, an electric circuit having a magnitude conforming to the magnitude of electric currents of the outputs should flow in the opposite side to that side from which the outputs are extracted and an excessive electric current should be cast away to the power source Vcc by way of a dummy transistor. Further, an electric current to be supplied from a constant-current source should be set in accordance with a number of outputs to be extracted.

Having now fully described the invention, it will be apparent to one of ordinary skill in the art that many changes and modifications can be made thereto without departing from the spirit and scope of the invention as set forth herein.

What is claimed is:

1. A collector dot AND circuit, comprising:
a first differential circuit including first and second transistors differentially connected to each other:
a first output transistor connected to an output electrode of said first transistor;
a second output transistor connected to an output electrode of said second transistor:
a second differential circuit including third and fourth transistors differentially connected to each other:
a predetermined plural number of third output transistors cascade connected to an output electrode of said third transistor for dividing an electric current outputted from said third transistor into electric currents of the predetermined plural number, an output terminal of one of said third output transistors being connected to an output terminal of said second output transistor so as to provide an AND output signal:
a same predetermined plural number of dummy transistors connected between an output electrode of said fourth transistor and a power source for causing an electric current having an equal magnitude to that of an electric current flowing through said third transistor to flow through said fourth transistor:

a first constant-current source for supplying a constant electric current to said first differential circuit: and a second constant-current source for supplying a constant electric current to said second differential circuit so that an electric current outputted from each of said third output transistors is equal in magnitude to an electric current outputted from said first output transistor.

2. A collector dot AND circuit according to claim 1, wherein one of said dummy transistors serves as an output transistor which provides another AND output signal together with another differential circuit.

3. A collector dot AND circuit according to claim 1, further comprising a third differential circuit including fifth and sixth transistors differentially connected to each other, a same predetermined plural number of fourth output transistors cascade connected to an output terminal of said fifth transistor, a same predetermined plural number of second dummy transistors connected between an output terminal of said sixth transistor and said power source for causing an electric current having an equal magnitude to that of an electric current flowing through said fifth transistor to flow through said sixth transistor, an output terminal of one of said third output transistors being connected to an output terminal of one of said second dummy transistors so as to provide another AND output signal, and a third constant-current source for supplying a constant electric current to said third differential circuit so that an electric current outputted from each of said fourth output transistors is equal in magnitude to an electric current outputted from said first output transistor.

* * * * *